United States Patent
Hernandez et al.

(10) Patent No.: US 9,448,279 B2
(45) Date of Patent: Sep. 20, 2016

(54) TEST SYSTEMS FOR ELECTRONIC DEVICES WITH WIRELESS COMMUNICATIONS CAPABILITIES

(75) Inventors: Diego C. Hernandez, Foster City, CA (US); Kevin Camilleri, Campbell, CA (US); Indranil Sen, Santa Clara, CA (US); Mohit Narang, Cupertino, CA (US); Manjit Walia, San Jose, CA (US)

(73) Assignee: Apple Inc., Cupertino, CA (US)

(*) Notice: Subject to any disclaimer, the term of this patent is extended or adjusted under 35 U.S.C. 154(b) by 908 days.

(21) Appl. No.: 13/225,290

(22) Filed: Sep. 2, 2011

(65) Prior Publication Data
US 2013/0060504 A1 Mar. 7, 2013

(51) Int. Cl.
G01D 3/00 (2006.01)
G01R 31/302 (2006.01)
G01R 31/28 (2006.01)

(52) U.S. Cl.
CPC ....... *G01R 31/3025* (2013.01); *G01R 31/2834* (2013.01)

(58) Field of Classification Search
CPC .................................................. G01R 31/2834
USPC ........................................................ 702/108
See application file for complete search history.

(56) References Cited

U.S. PATENT DOCUMENTS

| | | | | |
|---|---|---|---|---|
| 3,828,942 | A * | 8/1974 | Young | 414/11 |
| 4,817,750 | A * | 4/1989 | Ishida et al. | 180/168 |
| 5,847,293 | A | 12/1998 | Jones | |
| 6,137,303 | A * | 10/2000 | Deckert et al. | 324/757.03 |
| 6,249,342 | B1 * | 6/2001 | Cheng | 356/237.2 |
| 7,088,998 | B2 | 8/2006 | Tolonen | |
| 2003/0003883 | A1 * | 1/2003 | Wallace et al. | 455/115 |
| 2004/0129522 | A1 * | 7/2004 | Skowronski | 191/12.2 R |
| 2004/0207422 | A1 | 10/2004 | Lehtinen et al. | |
| 2006/0252419 | A1 * | 11/2006 | Liu | H04W 24/06 455/423 |
| 2007/0080000 | A1 * | 4/2007 | Tobey et al. | 180/21 |
| 2007/0080700 | A1 * | 4/2007 | Kolman | 324/765 |
| 2007/0089925 | A1 * | 4/2007 | Addleman | 180/313 |
| 2007/0159199 | A1 * | 7/2007 | Talwar | H04B 17/00 324/754.31 |
| 2007/0163219 | A1 * | 7/2007 | Fukuda et al. | 55/523 |
| 2008/0305754 | A1 | 12/2008 | Foegelle | |
| 2009/0201039 | A1 * | 8/2009 | Wu et al. | 324/754 |
| 2010/0237879 | A1 * | 9/2010 | Wang | G01R 31/2894 324/627 |

(Continued)

FOREIGN PATENT DOCUMENTS

| | | |
|---|---|---|
| EP | 0848260 | 6/1998 |
| JP | 62-070915 | * 4/1987 |
| WO | WO 2008/151488 | * 12/2008 |

*Primary Examiner* — Michael Nghiem
(74) *Attorney, Agent, or Firm* — Treyz Law Group, P.C.; Michael H. Lyons

(57) ABSTRACT

A test system may be provided for performing wireless communications testing of electronic devices in a building. The test system may include a mobile cart that transports the device under test to test stations in the building. The test system may include a visible guide track having visible test station indicators. The mobile cart may include an optical sensor for detecting the visible guide track and the visible test station indicators. The mobile cart may transport the device under test to the test stations along the visible guide track. The mobile cart may include a rotating stage to which the device under test may be mounted. The rotating stage may be used to rotate the device under test while the device under test transmits test data to wireless communications equipment in the building during wireless communications testing of the device under test.

12 Claims, 15 Drawing Sheets

(56) References Cited

U.S. PATENT DOCUMENTS

2011/0074458 A1* 3/2011 Di Stefano et al. ..... 324/757.01
2011/0115040 A1* 5/2011 Su et al. ....................... 257/432
2011/0217937 A1* 9/2011 Cook ..................... H04B 17/00
 455/67.14
2011/0257923 A1* 10/2011 Boulton ........................ 702/117
2012/0139571 A1* 6/2012 Nickel ............... G01R 29/0821
 324/750.26

* cited by examiner

TEST SYSTEMS FOR ELECTRONIC DEVICES WITH WIRELESS COMMUNICATIONS CAPABILITIES

BACKGROUND

This relates generally to testing wireless electronic devices and more particularly, to testing wireless electronic devices in a real-world environment.

Electronic devices such as portable computers and cellular telephones are often provided with wireless communications capabilities. For example, electronic devices may use long-range wireless communications circuitry such as cellular telephone circuitry to communicate using cellular telephone bands at 850 MHz, 900 MHz, 1800 MHz, 1900 MHz, and 2100 MHz. Electronic devices may use short-range wireless communications circuitry to handle communications with nearby equipment. For example, electronic devices may communicate using the WiFi® (IEEE 802.11) bands at 2.4 GHz and 5 GHz and the Bluetooth® band at 2.4 GHz.

During normal operation, wireless electronic devices are often used to communicate data to wireless communications equipment in a building. For example, a wireless electronic device may exchange data with a remote computer or another wireless electronic device using a wireless communications router located in the building. The efficiency with which a wireless electronic device exchanges data with the computer is typically affected by the distance of the device from the router, orientation of the device and building structures such as walls, doors, windows, etc., between the device and the router.

During testing, wireless electronic devices under test (DUTs) are typically tested in fixed test stations. Fixed test stations provide repeatable test conditions for testing multiple devices under the same conditions. However, fixed test stations may not provide sufficient information on the communications performance of the DUT in real-world conditions that mimic the typical use of the device by a user.

It would therefore be desirable to provide improved test systems for electronic devices with wireless communications capabilities.

SUMMARY

A test system may be provided for performing wireless communications tests on electronic devices. The electronic devices may have wireless communications circuitry. The wireless communications circuitry may be used to communicate with the test system during testing. The test system may include a path in a building. The test system may include a computer controlled mobile cart for moving the device under test along the path in the building. The path may include one or more test stations at which the mobile cart may stop during wireless communications tests of the device under test.

The path may be defined by a visible guide track. The mobile cart may follow the visible guide track using optical sensors in the cart. The visible guide track may include visible test station indicators. The optical sensors on the cart may be configured to recognize visible test station indicators. The mobile cart may be configured to stop for wireless communications testing when the optical sensors recognize the visible test station indicators.

The mobile cart may include a rotating stage for mounting the device under test. The rotating stage may be configured to rotate the device under test during wireless communications testing at each test station.

The mobile cart may include one or more active spools for storing communications and power cables on the cart. The active spools may include torque sensors and motors. The motors may be configured to turn the spools based on torques measured by the torque sensors. The motors may be configured to maintain a constant tension in the communications and power cables by turning the spools.

The test system may include guide structures for guiding the communications and power cables as the mobile cart moves along the path. The test system may include control equipment for controlling the motion of the cart along the path and for controlling the rotating stage during wireless communications tests. The test system may include wireless communications equipment for communicating with the device under test during wireless communications testing. The test system may include computing equipment connected to the wireless communications equipment for gathering test data using the wireless communications equipment during wireless communications testing.

The computing equipment may be used to analyze and store the test data gathered during the wireless communications testing at each test station. Test data gathered during the wireless communications testing at each test station may include information on effects of multi-path communications interference in a real-world environment.

Further features of the present invention, its nature and various advantages will be more apparent from the accompanying drawings and the following detailed description.

DETAILED DESCRIPTION

Wireless electronic devices include antenna and transceiver circuitry that support wireless communications. Examples of wireless electronic devices include desktop computers, computer monitors, computer monitors containing embedded computers, wireless computer cards, wireless adapters, televisions, set-top boxes, gaming consoles, routers, or other electronic equipment. Examples of portable wireless electronic devices include laptop computers, tablet computers, handheld computers, cellular telephones, media players, and small devices such as wrist-watch devices, pendant devices, headphone and earpiece devices, and other miniature devices.

Devices such as these are often provided with wireless communications capabilities. For example, electronic devices may use long-range wireless communications circuitry such as cellular telephone circuitry to communicate using cellular telephone bands at 850 MHz, 900 MHz, 1800 MHz, and 1900 MHz (e.g., the main Global System for Mobile Communications or GSM cellular telephone bands). Long-range wireless communications circuitry may also handle the 2100 MHz band.

Electronic devices may use short-range wireless communications links to handle communications with nearby equipment. For example, electronic devices may communicate using the WiFi® (IEEE 802.11) bands at 2.4 GHz and 5 GHz and the Bluetooth® band at 2.4 GHz. It is sometimes desirable to receive satellite navigation system signals such as signals from the Global Positioning System (GPS). Electronic devices may therefore be provided with circuitry for receiving satellite navigation signals such as GPS signals at 1575 MHz.

Figure 1:
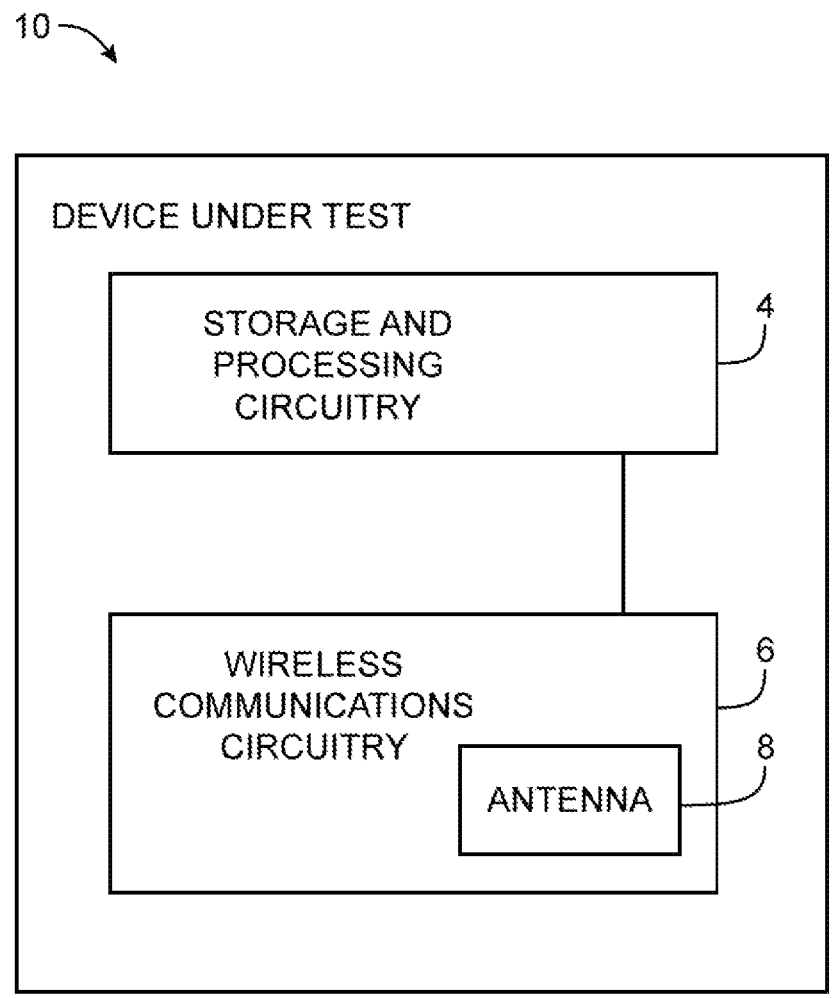
FIG. 1 is a diagram of an illustrative wireless device under test wireless communications circuitry in accordance with an embodiment of the present invention.

In testing environments, the wireless electronic devices are sometimes referred to as devices under test (DUTs). FIG. 1 shows an example of a test device such as DUT 10. DUT 10 may be a portable electronic device, a cellular telephone, a computer, a multimedia device, or other electronic equipment.

DUT 10 may have storage and processing circuitry such as storage and processing circuitry 4. Storage and processing circuitry 4 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 4 may be used to control the operation of device 10. This processing circuitry may be based on one or more microprocessors, microcontrollers, digital signal processors, application specific integrated circuits, etc.

Circuitry 4 may interact with wireless communications circuitry such as wireless communications circuitry 6. Wireless communications circuitry 6 may include one or more antennas such as antenna 8. Antenna 8 may configured to send and receive data at cellular telephone bands (e.g., 850 MHz, 900 MHz, 1800 MHz, and 1900 MHz), WiFi® bands at 2.4 GHz and 5 GHz and the Bluetooth® band at 2.4 GHz. Wireless communications circuitry may include additional components such as an analog-to-digital converter (ADC), a digital-to-analog converter (DAC), a digital down-converter (DDC), a digital up-converter (DUC) or other components.

During testing, wireless communications circuitry 6 may be used to transmit data generated by storage and processing circuitry 4 to a test system for testing DUT 10.

Figure 2A:
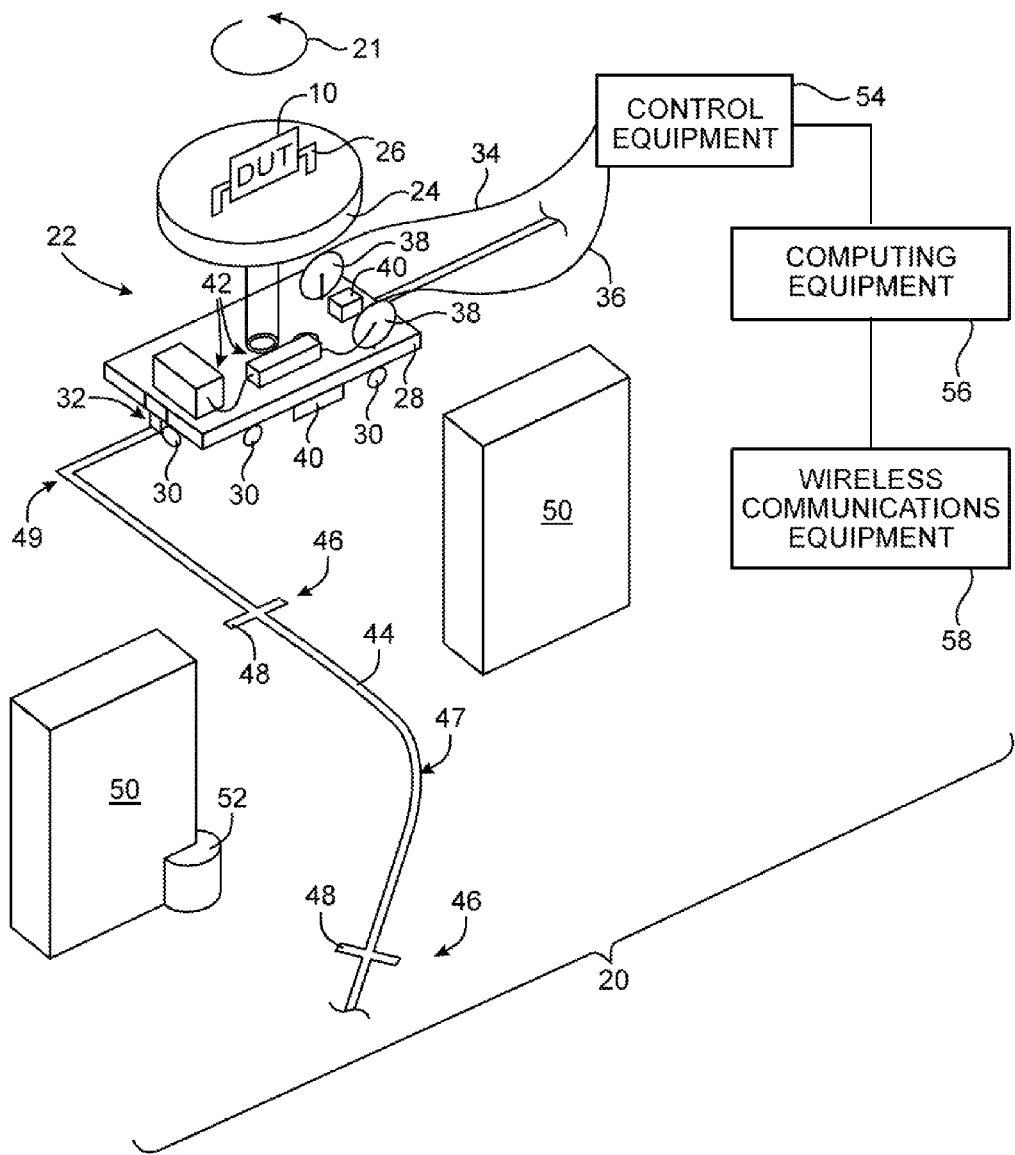
FIG. 2A is a diagram of an illustrative test system including a mobile cart, control equipment, computing equipment, wireless communications equipment and a visible guide track along which the mobile cart transports the device under test in accordance with an embodiment of the present invention.

During testing, one or more wireless devices (e.g., one or more of DUTs 10) may be tested in a test system such as test system 20 of FIG. 2A. As shown in FIG. 2A, DUT 10 may be mounted to a computer controlled mobile cart such as computer controlled mobile cart 22 (sometimes referred to herein as mobile cart, mobile test station, roving test vehicle, automatic roving test vehicle, rover, cart, etc.). DUT 10 may be mounted to mobile cart 22 using mounting structures such as mounting structures 26. Mounting structures 26 may be formed from plastic or other materials. Mounting structures 26 may include materials configured to mimic the physical and electrical properties of human arms or hands to simulate a user holding DUT 10 during testing.

Mobile cart 22 may include one or more rotating stages such as rotating stage 24. Rotating stage 24 may be used for rotating DUT 10 in a direction such as direction 21 (or opposite to direction 21) during wireless communications testing of DUT 10. Rotating stage 24 may be formed from any suitable non-conducting material (e.g., expanded polystyrene foam, Styrofoam® plastic, etc.) Rotating stage 24 may be mounted to a support structure such as support structure 28. Support structure 28 may be formed from any suitable non-conducting material such as wood, plastic, etc. Support structure 28 may be used to support operational equipment for computer controlled mobile cart 22. Operational equipment that may be mounted on support structure 28 may include one or more spools such as spools 38, one or more motors such as motors 40, cart control equipment 42, one or more optical sensors such as optical sensors 32 or other operational equipment. Spools 38 may be used to store cables such as power cable 34 and communications cable 36 on mobile cart 22. Cart control equipment 42 may include one or more torque sensors for sensing a torque on spools 38 due to cables 34 and 36. Motors 40 may include one or more motors for turning spools 38 depending on torques measured by cart control equipment 42. Cart control equipment 42 may be used to operate motors 40 when torques on spools 38 are above or below predetermined thresholds. Cart control equipment 42, motors 40 and spools 38 may be configured to maintain a constant tension on cables 34 and 36 during operation of mobile cart 22.

Mobile cart 22 may be supported on wheels such as wheels 30. Wheels 30 may include wheels that connected to one or more motors 40 and wheels that are not connected to any motors. Wheels 30 that are connected to motors 40 may be used to drive and turn mobile cart 22. Wheels 30 that are not connected to any motor may include wheels having hinges that help maintain the height of support structure 28. Maintaining the height of support structure 28 may help mobile cart 22 follow a path such as path 44 during testing of DUT 10. Path 44 may be formed from a visible guide track. Visible guide track 44 (sometimes referred to herein as visible test track, or test track) may be sensed by cart 22 using optical sensors such as optical sensor 32. Optical sensors 32 may be mounted on or under support structure 28. Optical sensors 32 may include one or more light sensors capable of detecting visible test track 44. Cart control equipment 42 may be used to control a drive system configured to guide mobile cart 22 along path 44 using signals measured by optical sensors 32. The drive system may include wheels 30 and some of motors 40. Controlling the drive system to guide mobile cart 22 along path 44 may include using cart control equipment 42 to turn some of wheels 30 using some of motors 40 to direct mobile cart 22 along path 44 using signals measured by optical sensors 32. Signals measured by optical sensors 32 may be transmitted using communications cable 36 to control equipment such as control equipment 54. Control equipment 54 may be used to relay signals from optical sensors 32 to computing equipment 56. Computing equipment 56 may be used to generate signals to be sent by control equipment 54 along communications cable 36 to direct motors 40 to turn wheels 30 in such a way that mobile cart 22 follows visible test track 44.

Test track 44 may include one or more turns such as turn 49, one or more bends such as bend 47 and one or more visible test station indicators such as visible test station indicators 48. Optical sensors 32 may be configured to recognize turns 49, bends 47 and visible test station indicators 48. Turns 49 and bends 47 may be used to direct mobile cart 22 around structures such as structures 50 in a building. Structures 50 may include walls of a hallway, doorways, doors, floors, ceilings, other obstacles, or other building structures. Structures 50 may help generate multi-path communications interference that inhibits data transfer between DUT 10 and wireless communications equipment 58. Test system 20 may be configured to test the effects of multi-path communications interference in a real-world environment.

Test stations such as test stations 46 that are indicated by visible test station indicators 48 of visible test track 44 may be arranged along track 44 such that multi-path communications interference may be monitored at multiple predefined positions with respect to wireless communications equipment 58. Test stations 46 may be arranged along track 44 such that wireless communications tests may be conducted at locations having structures 50 interposed between DUT 10 and wireless communications equipment 58. Wireless communications equipment 58 may include a wireless router that is connected to computing equipment 56. DUT 10 may transmit test data to wireless communications equipment 58 that is relayed to computing equipment 56. Computing equipment 56 may be used to store and analyze test data received by wireless communications equipment 58.

Mobile cart 22 may be configured to stop for a predetermined amount of time when optical sensors 32 on cart 22 detect visible test station indicators 48. Cart control equipment 42 mounted on support structure 28 may be used to drive one of motors 40 when cart 22 is stopped at test stations 46 such that rotating stage 24 turns DUT 10 in direction 21 (or opposite to direction 21). Wireless communications testing using test system 20 may include transmission of test data from DUT 10 to wireless communications equipment 58 while rotating stage 24 turns DUT 10. Computing equipment 56 may be used to generate control signals using control equipment 54 that cause cart control equipment 42 to turn rotating stage 24 using motors 40 such that DUT 10 transmits test data at a plurality of orientations during wireless communications testing of DUT 10 at each test station 46 along path 44.

Test system 20 may include guide structures such as guide structure 52. Guide structure 52 may be configured to guide cables such as cables 34 and 36 around structures 50 as mobile cart 22 moves along path 44 during wireless communications testing of DUT 10. Test system 20 may include portions on multiple floors of a building.

Figure 2B:
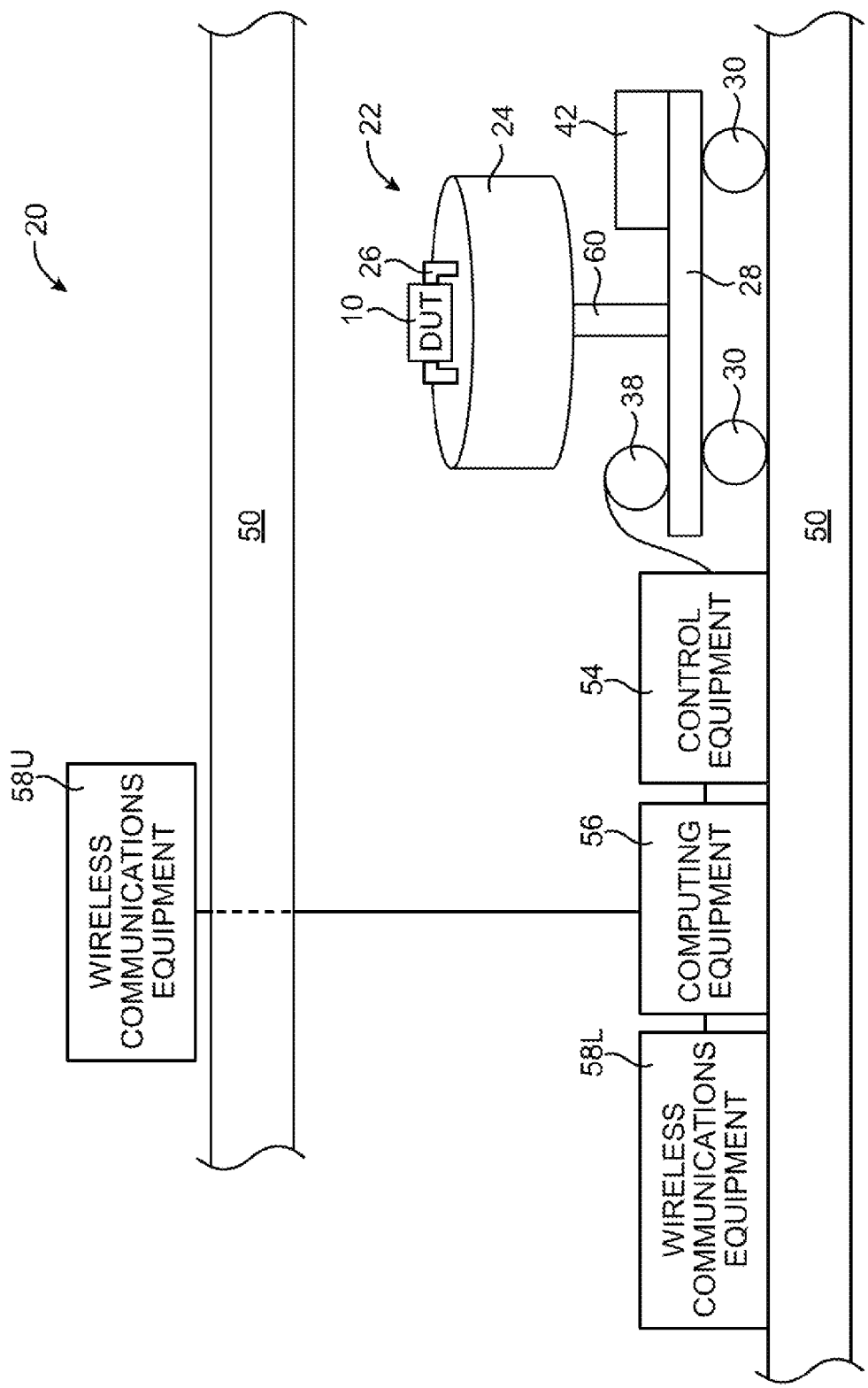
FIG. 2B is a diagram of an illustrative test system including wireless communications equipment on multiple floors of a building in accordance with an embodiment of the present invention.

As shown in FIG. 2B, test system 20 may be configured such that wireless communications equipment 58 (see FIG. 2A) includes a portion 58L on a lower floor of a building and an upper portion 58U on a relatively higher floor of a building. In the example of FIG. 2B, structures 50 include building structures that form lower and upper floors of a building. Test stations such as test stations 46 of FIG. 2A may be arranged such that wireless communications tests are conducted at locations having structures 50 interposed between DUT 10 and upper wireless communications equipment 58U and lower wireless communications equipment 58L. Upper wireless communications equipment 58U and lower wireless communications equipment 58L may each include a wireless router that is connected to computing equipment 56. At each test station 46, DUT 10 may transmit test data alternately to upper wireless communications equipment 58U and lower wireless communications equipment 58L that is then relayed to computing equipment 56. Computing equipment 56 may be used to store and analyze test data received by both upper wireless communications equipment 58U and lower wireless communications equipment 58L. Cart control equipment 42 mounted on support structure 28 may be used to turn rotating stage 24 in order to rotate DUT 10 during wireless communications testing of DUT 10. Wireless communications testing using test system 20 may include transmission of test data from DUT 10 alternately to upper wireless communications equipment 58U and lower wireless communications equipment 58L while rotating stage 24 turns DUT 10. If desired, computing equipment 56 may be configured to turn off a selected one of upper wireless communications equipment 58U or lower wireless communications equipment 58L while DUT 10 is transmitting test data to the other of upper wireless communications equipment 58U or lower wireless communications equipment 58L. In this way, interference from, for example, multiple wireless routers may be avoided during wireless communications testing of DUT 10.

Figure 3:
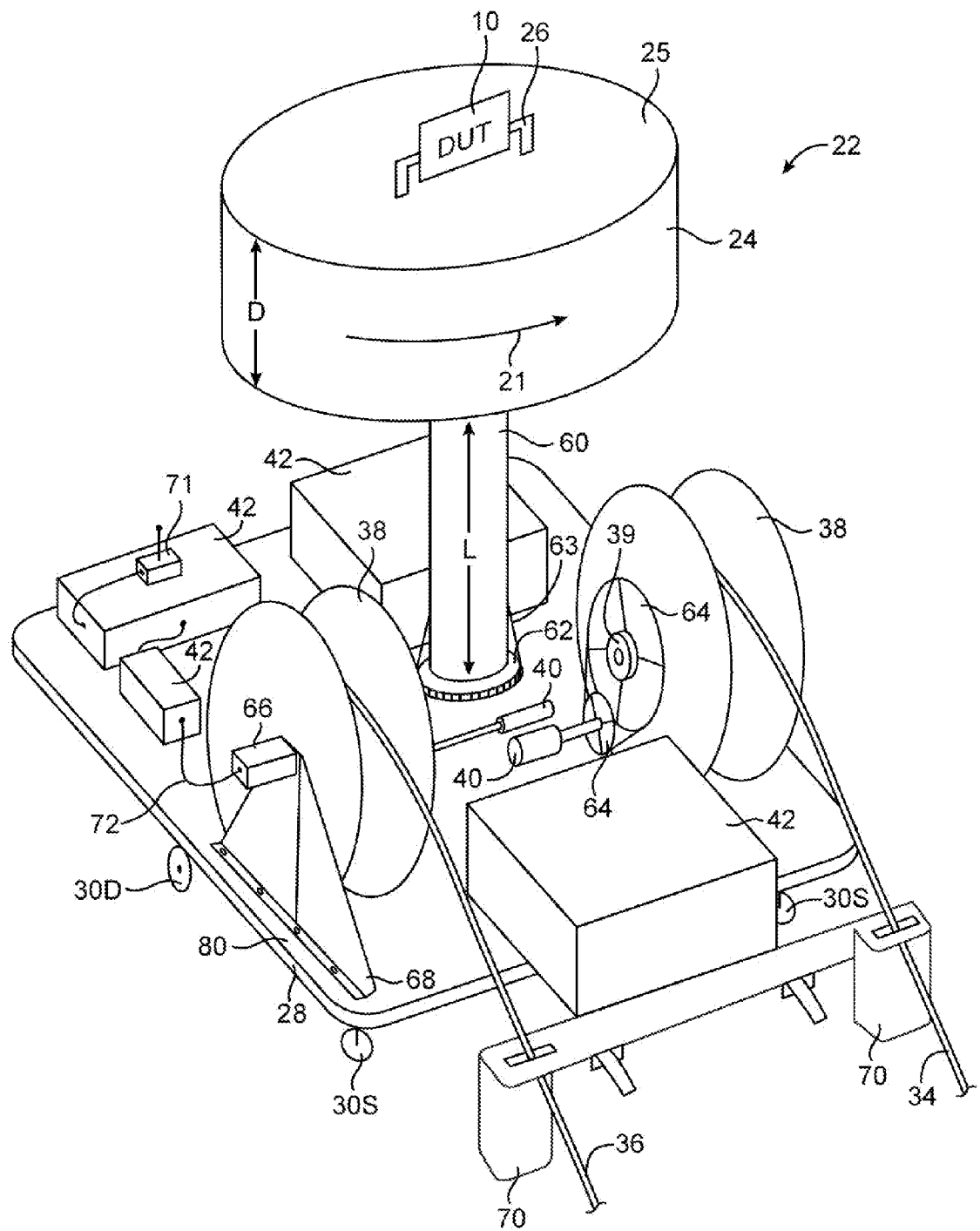
FIG. 3 is a diagram of an illustrative mobile cart that has a rotating stage, spools for storing communications and power cables and multiple motors in accordance with an embodiment of the present invention.

FIG. 3 is a diagram of an illustrative embodiment of computer controlled mobile cart 22. As shown in FIG. 3, rotating stage 24 of computer controlled mobile cart 22 may be mounted to support structure 28 using a stage support such as stage support 60. In order to limit interference by cart structures with wireless data transmitted from or received by DUT 10 during wireless communications testing, cart structures may be optimized to keep conducting structures and electrical components far from DUT 10. For example, rotating stage 24 may be formed from any non-conducting material (e.g., expanded polystyrene foam, Styrofoam®, plastic, etc.). Stage support 24 may be formed from any suitable non-conducting material (e.g., plastic, glass, etc.). Stage support 60 may have a length L that is configured to isolate DUT 10 from cart control equipment 42 or other conducting or electrically active equipment on cart 22. For example, length L may be more than one foot, more than two feet, more than three feet, etc. Rotating stage 24 may have a depth D that helps isolate DUT 10 from cart control equipment 42 or other conducting or electrically active equipment on cart 22. For example, depth D may be more than one foot, more than two feet, more than three feet, etc.

In order to further isolate DUT 10 from conducting structures that may interfere with wireless communications testing, other cart structures that reach more than 3 to 4 inches above support structure 28 may preferably be formed from non-conducting materials. As an example, spools 38 may be formed from any suitable non-conducting materials (e.g., plastic, etc.).

As shown in FIG. 3, spools 38 may be used to store cables such as power cable 34 and communications cable 36 on cart 22. Power cable 34 may be used to provide power to mechanical and electrical components of cart 22. Communications cable 36 may include one or more optical fibers. In one preferred embodiment which is sometimes described herein as an example, communications cable 36 may include six optical fibers. Optical fibers in communications cable 36 may be used to convey signals (e.g., for controlling drive wheels 30, rotating stage 24, spools 38), or to convey data between cart components and computing equipment 56 (see FIG. 2A). In the example of FIG. 3, each spool 38 is controlled by a motor 40. Motors 40 may be coupled to spools 38 using one or more gears such as gears 64 that transfer the motion of motors 40 to spools 38. Motors 40 may be commanded by computing equipment 56 to turn spools 38 based on torque information gathered using torque sensors such as torque sensor 39 attached to spools 38. Torque sensor 39 may be implemented as a part of motors 40 or may be implemented as a separate component mounted to spools 38. Spools 38 may be mounted to support structure 28 using spool mounting structures such as spool mounting structures 68. Cables 34 and 36 may be held in a particular position with respect to cart 22 using cable guide structures such as cable guide structures 70. Cable guide structures 70 may be mounted to support structure 28 and may each include one or more rolling members that allow cables 34 and 36 to pass through cable guide structures 70.

Cables 34 and 36 may be coupled to cart control equipment 42 using cable interfaces such as cable interface 66 of FIG. 3. Cart control equipment may be implemented as a single integrated module or may be distributed in several control modules as shown in FIG. 3. Portions of cart control equipment 42 (i.e., different modules of cart control equipment 42) may be coupled together using cables such as cable 72 that pass above support structure 28 or may be coupled together using cables that pass under support structure 28 (not shown).

As shown in FIG. 3, stage support 60 may be coupled to cart control equipment 42 using one or more geared platforms such as geared platform 62. Geared platform 62 may be coupled to a motor housed in a module of cart control equipment 42 using a belt such as belt 63. Belt 63 and geared platform 62 may be used to transfer motion of a motor associated with cart control equipment 42 to stage support 60, thereby turning rotating stage 24 in a direction such as direction 21 during wireless communications testing of a DUT such as DUT 10 that is mounted to rotating stage 24 using mounting structures 26. Direction 21 is merely illustrative. Rotating stage 24 may be configured to turn opposite to direction 21 if desired.

Cart control equipment may include a manual drive control module such as manual drive control module 71. Manual drive control module 71 may be used to manually direct computer controlled mobile cart 22. For example, manual drive control module 71 may be used to move cart 22 into position at the start of track 44 (see FIG. 2A), may be used to move cart 22 when cart 22 is not in use for wireless communications testing, etc.

Motors 40 may include one or more motors mounted on top surface 80 of support structure 28 and may include one or more motors mounted on the bottom surface of support structure 28. As an example, motors 40 mounted on top surface 80 of support structure 28 may be used to control spools 38 while motors 40 mounted on the bottom surface of support structure 28 may be used to control drive wheels such as drive wheels 30D that drive and turn cart 22. In addition to drive wheels 30D that drive and turn cart 22, cart 22 may include support wheels such as support wheels 30S that support cart 22 and help maintain a constant height for support structure 28 of cart 22.

During normal operations of DUT 10, a user may place DUT 10 on various surfaces (e.g., on desktop made from wood, metal, glass, etc.) In order to test the effect of placing DUT 10 on various surfaces, rotating stage 24 may be provided with a top surface 25 that is formed from a material that is different from the material that forms the bulk of rotating stage 24. For example, top surface 25 may be formed from metal, wood, glass, stone, composite material or other suitable material. This is merely illustrative. If desired, top surface 25 may be formed from substantially the same material as rotating stage 24.

Figure 4:
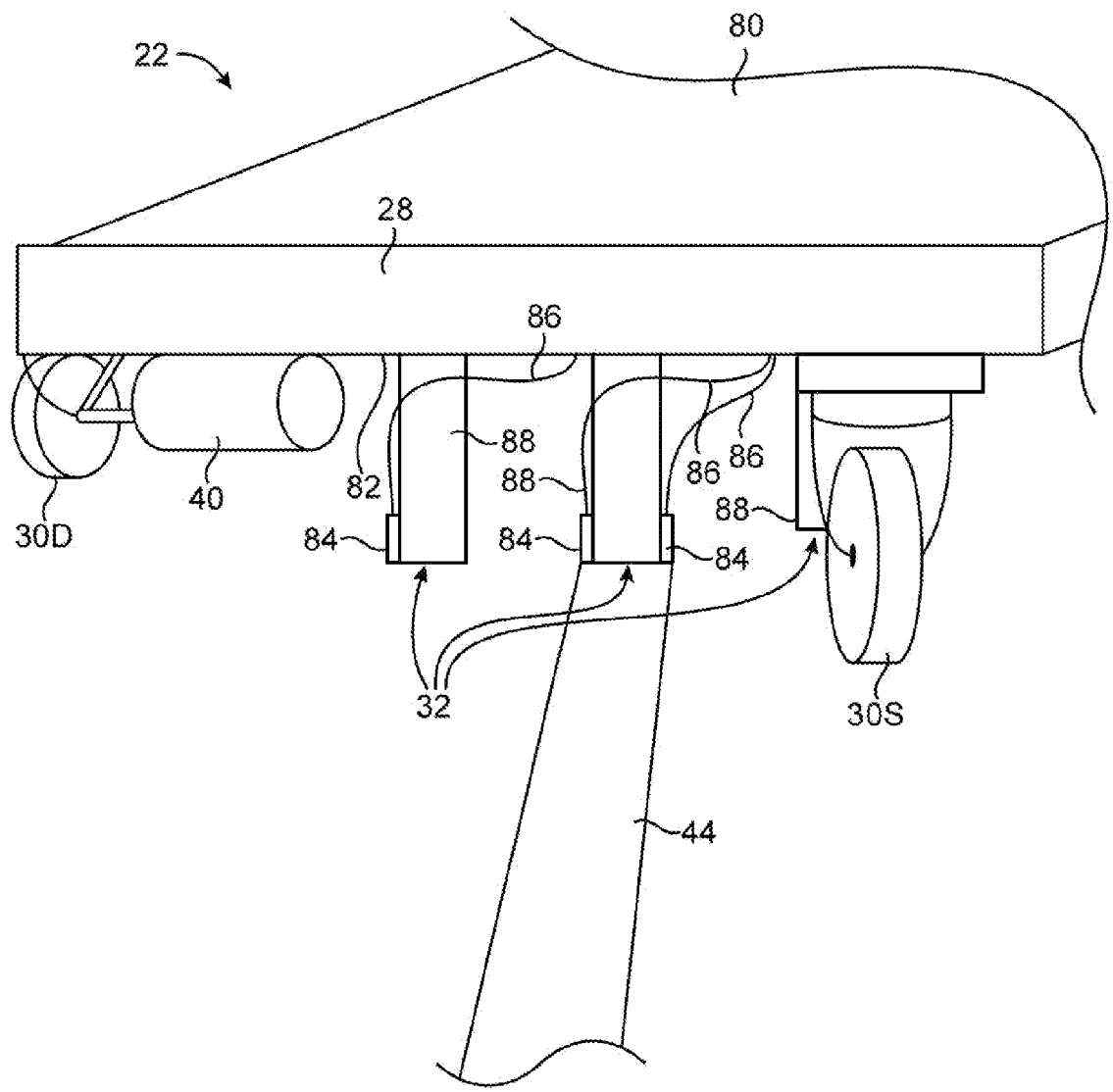
FIG. 4 is a cross-sectional side view of an illustrative portion of a mobile cart of the type shown in FIG. 3 having optical sensors, support wheels and drive wheels in accordance with an embodiment of the present invention.

As shown in FIG. 4, drive wheels 30D may be mounted on bottom surface 82 of support structure 28. Drive wheels such as drive wheels 30D may be controlled using a motor such as motor 40 that is mounted to bottom surface 82 of support structure 82. Mobile cart 22 may include any number of drive wheels 30D. In one preferred embodiment that is sometimes described herein as an example, mobile cart 22 may include a left drive wheel and a right drive wheel. Mobile cart 22 may be driven by turning both right and left drive wheels with motors 40. Mobile cart 22 may be turned by holding one drive wheel 30D in place while turning another drive wheel 30D. Alternatively, mobile cart 22 may be driven and turned by turning one drive wheel 30D at a different rate from another drive wheel 30D. Mobile cart 22 may include one or more support wheels such as support wheel 30S mounted to bottom surface 82 of support structure 28. Support wheels 30S may be hinged wheels that can turn when mobile cart 22 is turned using drive wheels 30D. Support wheels 30S may help maintain optical sensors such as optical sensor 32 at a constant height above test track 44.

Mobile cart 22 may include one or more optical sensors such as optical sensor 32 of FIG. 4. As an example, mobile cart 22 may include one optical sensor 32 mounted at the back of bottom surface 82 of support structure 28 and one optical sensor 32 mounted at the front of bottom surface 82 of support structure 28. In a configuration in which mobile cart 22 includes an optical sensor at the front of cart 22 and an optical sensor at the back of cart 22, information from both optical sensors may be used by computing equipment 56 (see FIG. 2A) to keep mobile cart 22 positioned on test track 44.

Optical sensor 32 may include one or more light sensors such as light sensors 84 mounted to sensor support structures 88. Light sensors 84 may be connected to cart control equipment 42 (see FIG. 3) using wires such as wires 86. Light sensors 88 of optical sensor 32 may be configured to sense visible guide track 44.

Figure 5:
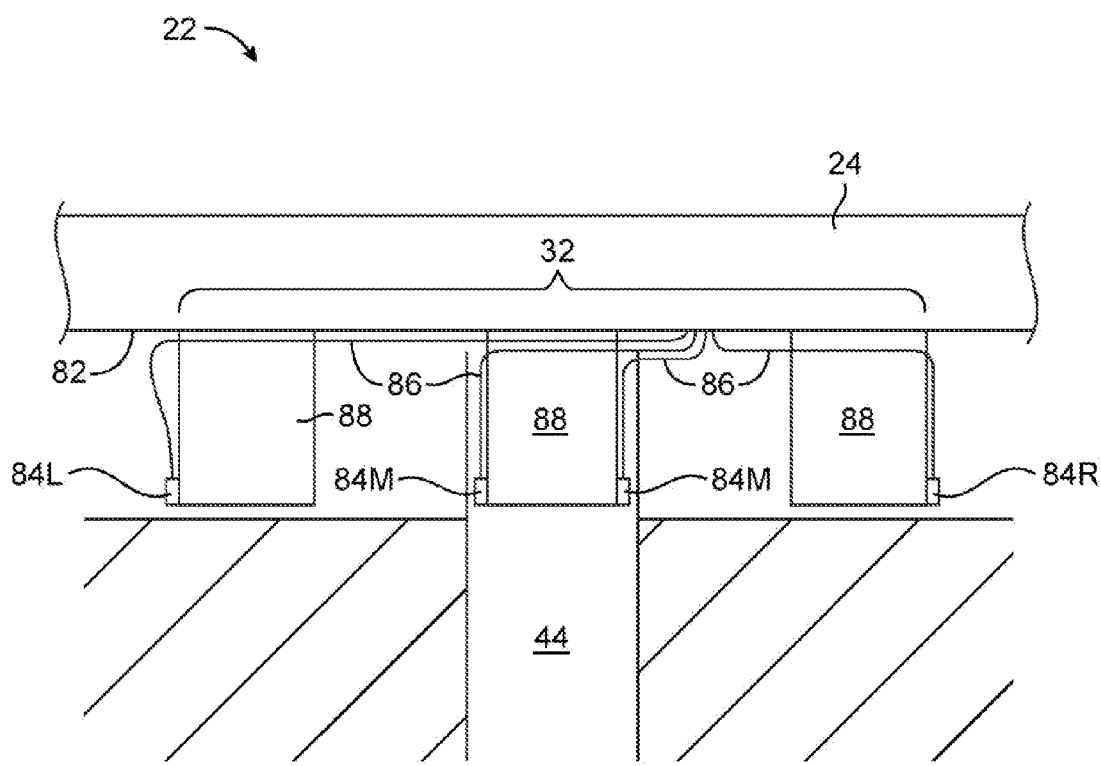
FIG. 5 is a front view of an illustrative optical sensor of the type that may be included in the mobile cart shown in FIG. 3 in accordance with an embodiment of the present invention.

An illustrative configuration that may be used for optical sensors 32 is shown in FIG. 5. In the example of FIG. 5, optical sensor 32 includes four light sensors 84 that are mounted to three sensor support structures 88. Sensor support structures 88 are attached to bottom 82 of support structure 82. Middle light sensors 84M are attached on opposing sides of middle sensor support structure 88. Middle light sensors 84 may be configured such that they remain over test track 44 (i.e., middle light sensors 84 may generate signals requiring no action when track 44 is detected below middle light sensors 84M and may generate signals requiring corrective action when track 44 is not detected below.)

Light sensor 32 may include two additional light sensors 84 such as left light sensor 84L and right light sensor 84R mounted to two outer sensor support structures 88 that are mounted to support structure 24 on opposing sides of middle sensor support structure 88. Left and right sensors 84L and 84R may be configured to remain on opposing sides of test track 44 (i.e., left and right light sensors 84L and 84R may generate signals requiring no action when track 44 is not detected below left and right light sensors 84L and 84R and may generate signals requiring corrective action when track 44 is detected below.) Signals generated by light sensors 84 may be conveyed to computing equipment 56 (see FIG. 2A) using wires such as wires 86.

Middle light sensors 84M mounted to middle sensor support structure 88 may be primarily configured to help mobile cart 22 navigate substantially straight portions of test track 44. Left and right light sensors 84L and 84R mounted to outer sensor support structures 88 may be primarily configured to help mobile cart 22 navigate turns in test track 44 and detect visible test station indicators 48 at test stations 46 along test track 44.

Figure 6:
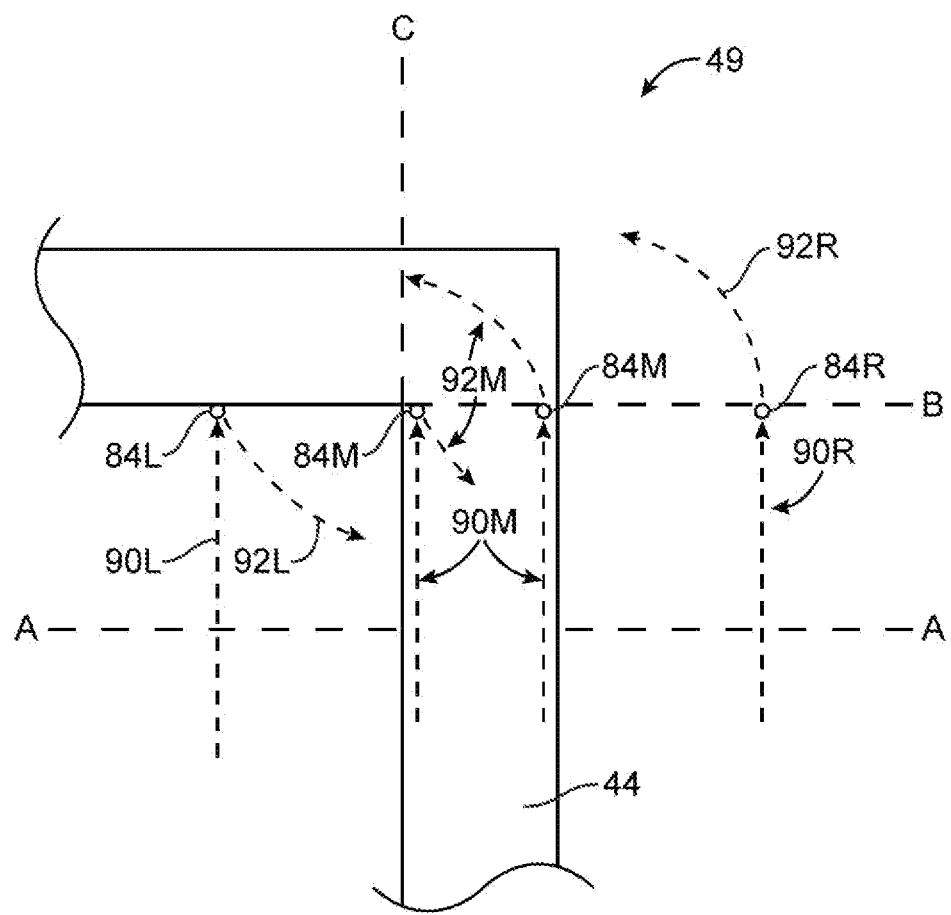
FIG. 6 is an illustrative diagram showing how optical sensors of the type shown in FIG. 5 may detect a turn in a visible guide track in accordance with an embodiment of the present invention.

A diagram showing how light sensors 84 may be used to detect a turn in test track 44 is shown in FIG. 6. As shown in FIG. 6, as mobile cart 16 travels from point A to point B along test track 44, middle light sensors 84M remain over test track 44 along paths 90M and continuously detect test track 44 while left and right light sensors 84L and 84R remain on opposing sides of test track 44 and do not detect test track 44. When light sensors 84 reach point B, left light sensor 84L detects test track 44 while right light sensor 84R does not detect test track 44. Left light sensor 84L detecting test track 44 while right left light sensor 84R does not detect test track 44 may indicate a left turn in test track 44.

In response to signals from light sensors 84 indicating a left turn in test track 44, computing equipment 56 (see FIG. 2A) may direct a left drive wheel 30D (see FIG. 4) to stop while a right drive wheel 30D turns. This may cause left light sensor 84L and one of middle light sensors 84M to reverse direction along curved paths 92L and 92M, respectively. Stopping a left drive wheel 30D while turning a right drive wheel 30D may cause right light sensor 84R to change direction along right path 92R while a second one of middle light sensors 84M moves forward along curved path 92M. Mobile cart 22 may continue along curved paths 92 until left light sensor 84L reaches point C along test track 44 and left light sensor 84L detects test track 44. After left light sensor 84L detects track 44 at point C, both drive wheels 30D of mobile cart 22 may again be turned together in order to move mobile cart 22 forward. Signals generated by middle light sensors 84M may then be used to make minor adjustments to the path of cart 22 to complete the turn or an iterative process of detecting track 44 with left light sensor 84L may be used to complete the turn. The 90 degree left turn of FIG. 6 is merely illustrative and other types of turns (e.g., 90 degree right turns, left turns at other angles, right turns at other angles, etc.) may be executed in a similar manner.

Figure 7:
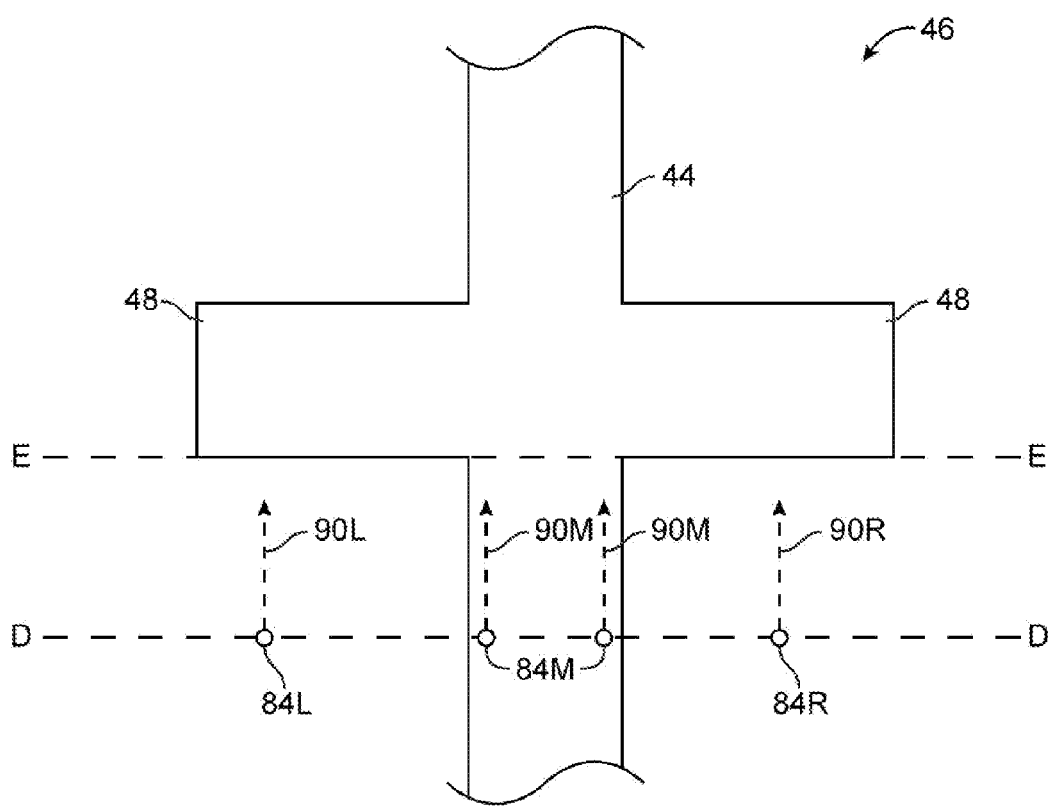
FIG. 7 is an illustrative diagram showing how optical sensors of the type shown in FIG. 5 may detect a visible test station indicator in a visible guide track in accordance with an embodiment of the present invention.

Left and right light sensors 84L and 84R may be used to detect other types of indicators along test track 44. For example, left and right light sensors 84L and 84R may be used to detect visible test station indicators such as visible test station indicator 48 of FIG. 7. As shown in FIG. 7, as mobile cart 16 travels from point D to point E along test track 44, middle light sensors 84M remain over test track 44 along paths 90M and continuously detect test track 44 while left and right light sensors 84L and 84R remain on opposing sides of test track 44 and do not detect test track 44. When light sensors 84 reach point E, both left and right light sensors 84L and 84R detect test track 44. Left and right light sensors 84L and 84R detecting test track 44 may indicate a visible test station indicator such as visible test station indicator 48 in test track 44.

In response to signals from light sensors 84 indicating a visible test station indicator in test track 44, computing equipment 56 (see FIG. 2A) may direct all drive wheels 30D (see FIG. 4) to stop for a previously determined amount of time while wireless communications tests are conducted. Wireless communications test conducted at test stations such as test station 46 may include transmitting data from DUT 10 to computing equipment 56 (see FIG. 2A) while rotating stage 24 (see FIG. 3) rotates DUT 10 through a fixed angle. Automatically detecting test stations such as test station 46 along test track 44 and rotating DUT 10 using rotation stage 24 may help compare multiple DUTs since it is known that each DUT was tested at the same location and in the same orientation.

Figure 8:
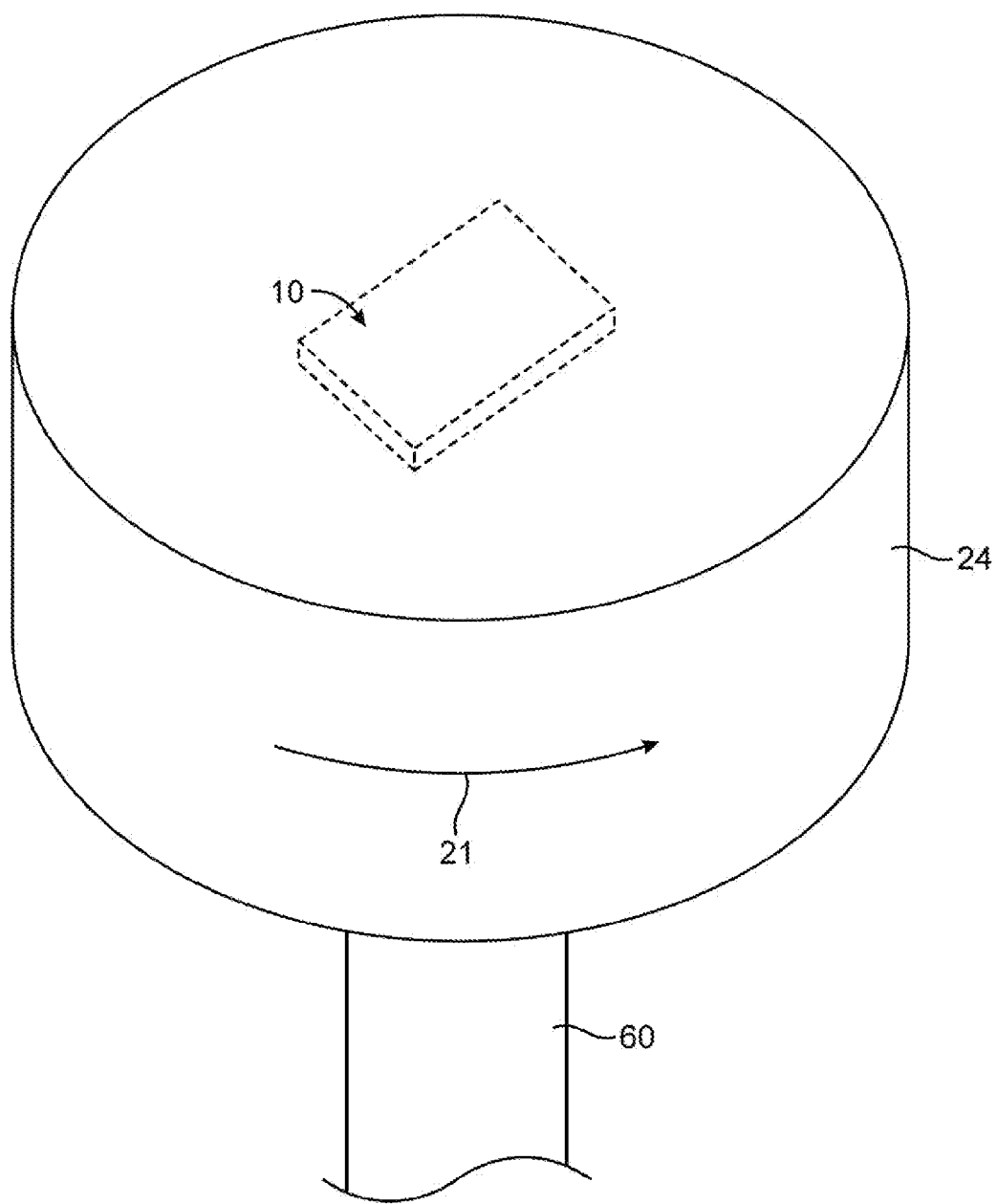
FIG. 8 is a diagram of an illustrative rotating stage for rotating a device under test in which the device under test is embedded in the rotating stage in accordance with an embodiment of the present invention.

An illustrative configuration that may be used for mounting DUT 10 to rotating stage 24 is shown in FIG. 8. In the example of FIG. 8, DUT 10 is embedded in rotating stage 24. As described above in connection with FIG. 3, rotating stage 24 may be formed from a non-conducting material such as (for example) expanded polystyrene foam. Embedding DUT 10 in the expanded polystyrene foam may help facilitate testing of DUTs having a relatively small size or individual DUT components that have not been fully assembled into a consumer ready device. After DUT 10 is seated in rotating stage 24, rotating stage 24 may be used to rotate DUT 10 in direction 21 (or opposite to direction 21) during wireless communications testing at test stations along a test track as described in connection with FIG. 2A.

Figure 9:
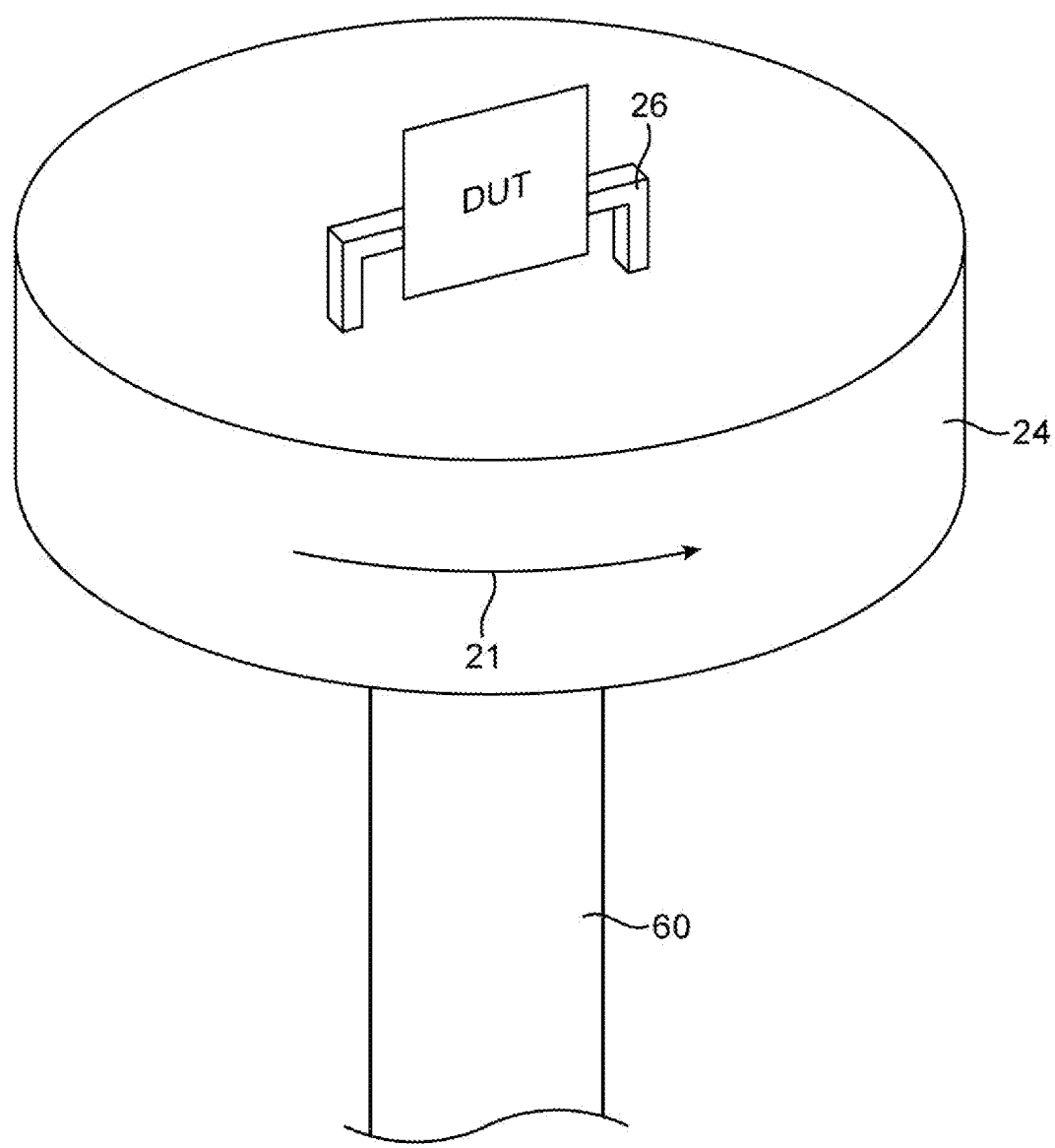
FIG. 9 is a diagram of an illustrative rotating stage for rotating a device under test in which the device under test mounted to the rotating stage using mounting structures in accordance with an embodiment of the present invention.

An alternative configuration that may be used for mounting DUT 10 to rotating stage 24 is shown in FIG. 9. In the example of FIG. 9, DUT 10 is mounted on rotating stage 24 using mounting structures 26. Mounting structures 26 may be formed from any suitable non-conducting material (e.g., plastic, glass, or suitable materials). Mounting DUT 10 to rotating stage 24 using mounting structures 26 may facilitate exchange of DUTs in mounting structures 26 for testing of multiple DUTs.

Figure 10:
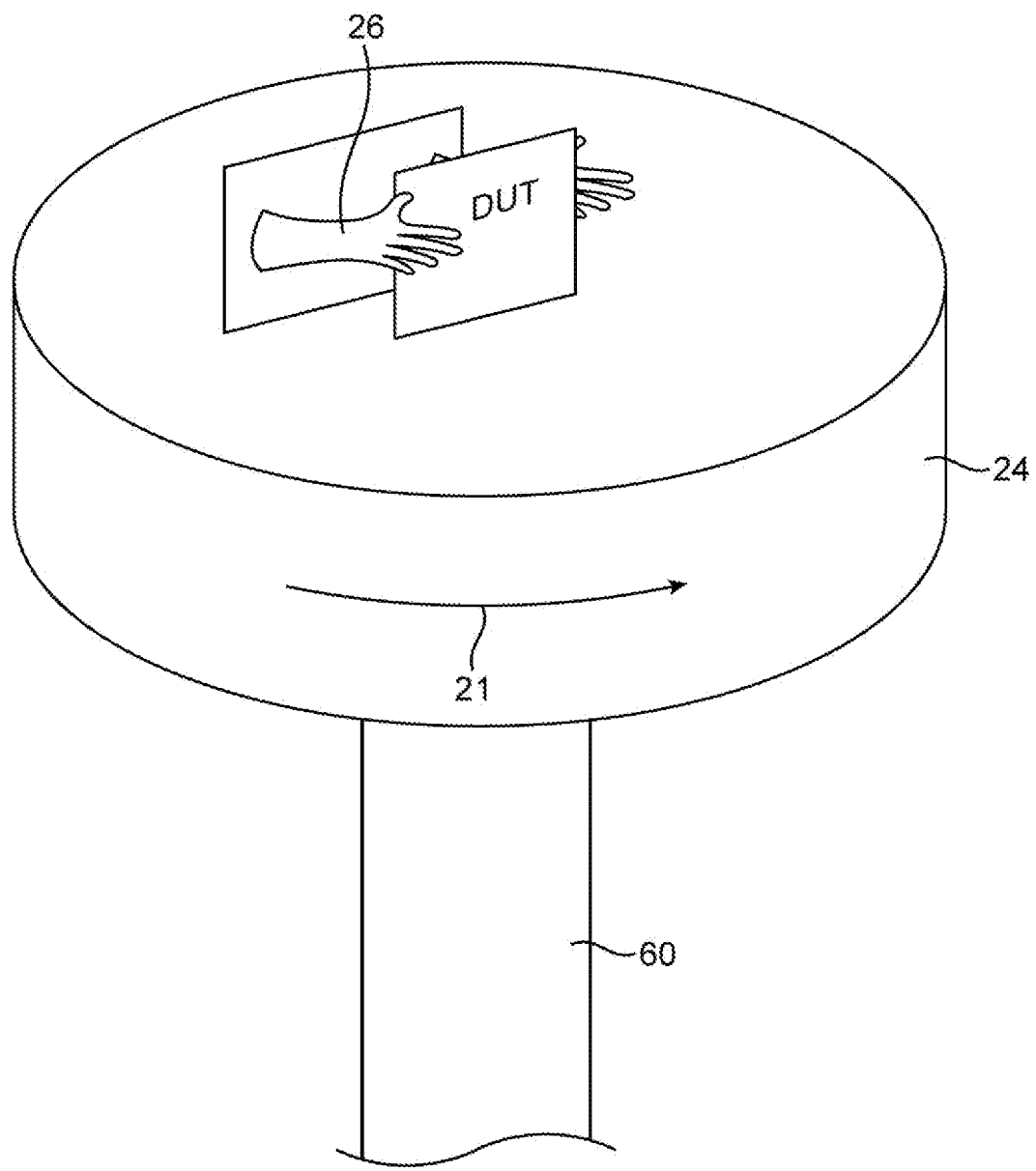
FIG. 10 is a diagram of an illustrative rotating stage for rotating a device under test in which the device under test mounted to the rotating stage using mounting structures that mimic physical and electrical properties of human hands and arms in accordance with an embodiment of the present invention.

An additional configuration that may be used for mounting DUT 10 to rotating stage 24 is shown in FIG. 10. In the example of FIG. 10, DUT 10 is mounted on rotating stage 24 using mounting structures 26 that have physical features that are similar to physical features of a user of a device. Because portable electronic devices are often operated while being held by a user, mounting structures 26 that have physical features that are similar to physical features of a user of a device may have a shape that is similar human hands and arms. Mounting structures 26 that have physical features that are similar to physical features of a user of a device may have electrical properties (e.g., resistance, conductivity, etc.) that are similar to electrical properties of human hands and arms. As an example, mounting structures 26 may be formed from silicon-carbonate material.

Mounting DUT 10 to rotating stage 24 using mounting structures 26 that are similar to physical features of a user of a device may improve the correlation of test results of wireless communications test of DUTs to the performance of devices during normal operation in a real-world environment. After DUT 10 is mounted to rotating stage 24 using mounting structures 26 of the type shown in FIG. 9 or 10, rotating stage 24 may be used to rotate DUT 10 in direction 21 (or opposite to direction 21) during wireless communications testing at test stations along a test track as described in connection with FIG. 2A. The examples of FIGS. 8, 9, and 10 are merely illustrative. If desired, DUT 10 may be placed on rotating stage 24 without mounting structures.

Figure 11:
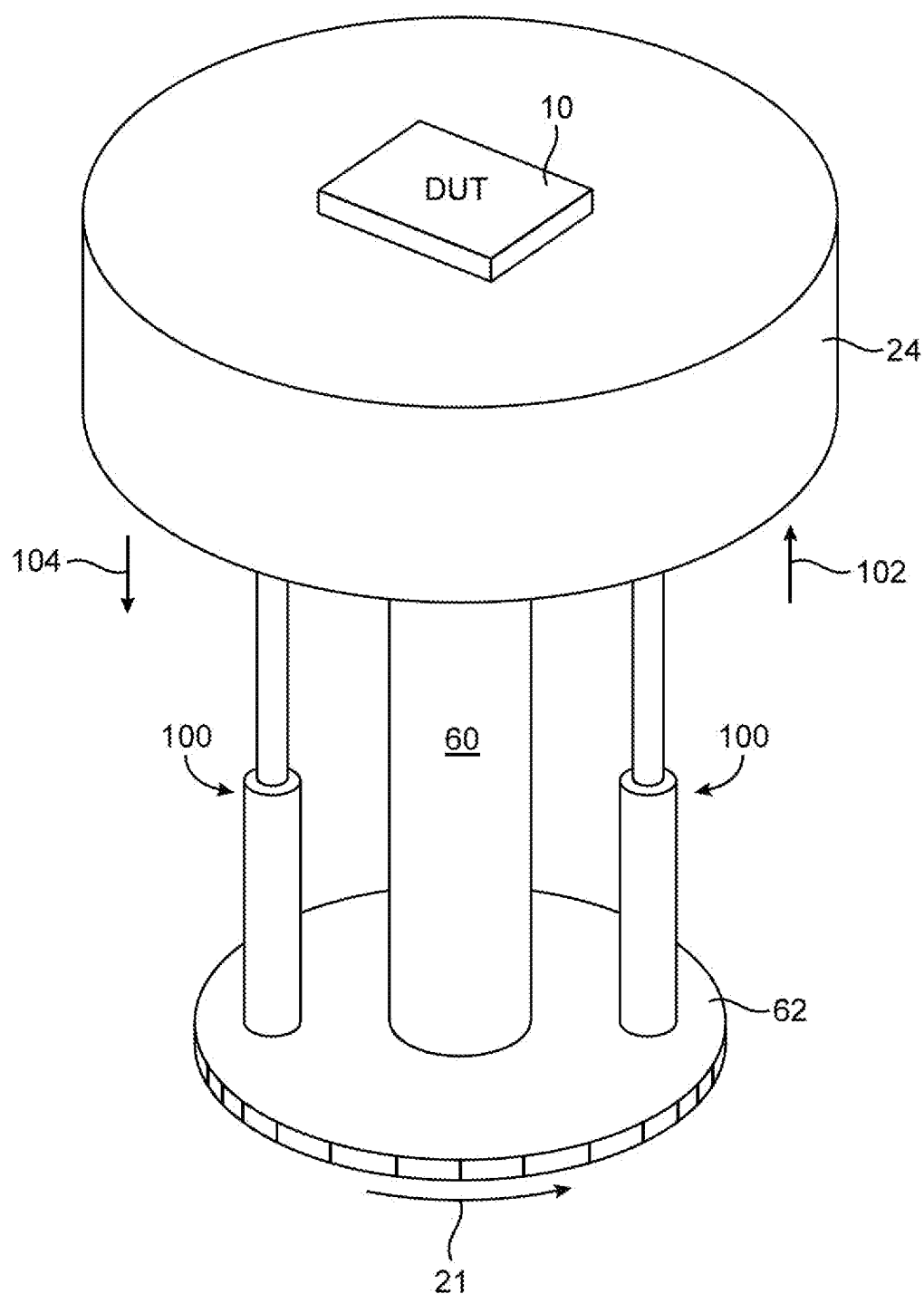
FIG. 11 is a diagram of an illustrative rotating stage for rotating a device under test in which rotating stage includes telescoping support structures in accordance with an embodiment of the present invention.

An illustrative configuration that may be used for stage support 60 of rotating stage 24 is shown in FIG. 11. As described in connection with FIG. 3, stage support 60 may be mounted to a geared platform such as geared platform 62. As shown in FIG. 11, rotating stage 24 may include one or more telescoping supports such as telescoping supports 100. Telescoping supports 100 may be configured to raise or lower rotating stage 24 in directions 102 or 104 respectively. Telescoping supports 100 may be raised or lowered by a test administrator prior to performing wireless communications testing on DUT 10, may be raised or lowered using cart control equipment 42 (see FIG. 3) prior to performing wireless communications testing on DUT 10 or may be raised or lowered into one or more positions during wireless communications testing at one or more test stations such as test stations 46 along test track 44 (see e.g., FIG. 7). Telescoping supports 100 may be formed from any suitable non-conducting material (e.g., plastic, etc.) so that telescoping supports 100 do not interfere with wireless testing of DUT 10. Telescoping supports 100 may be mounted to geared platform 62 so that telescoping supports 100 rotate with rotating stage 24 in direction 21 (or opposite to direction 21) during wireless communications testing of DUT 10.

Figure 12:
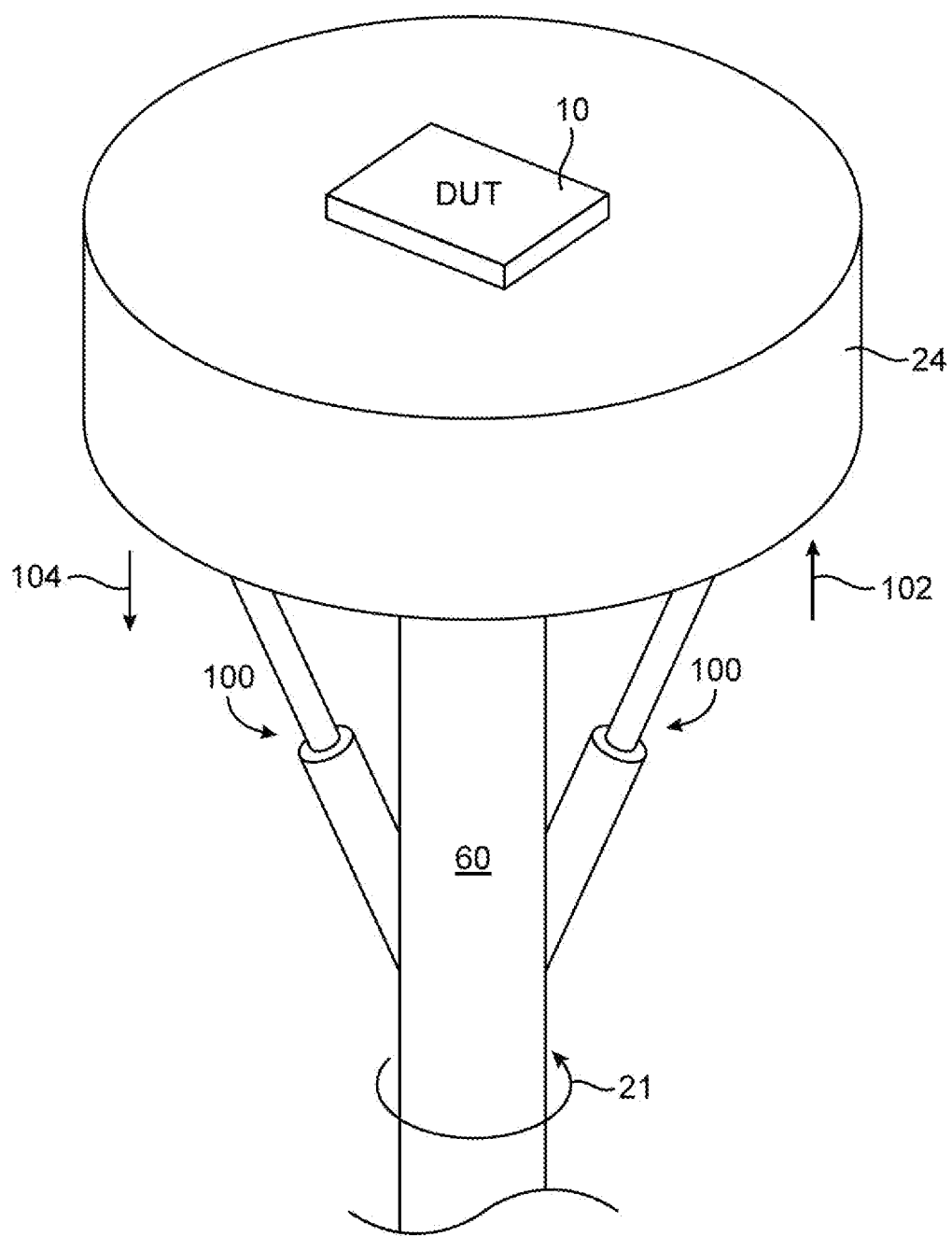
FIG. 12 is a diagram of an illustrative rotating stage for rotating a device under test in which rotating stage includes telescoping support structures mounted to a stage support structure in accordance with an embodiment of the present invention.

Telescoping supports 100 may alternatively be mounted to stage support 60 as shown in FIG. 12. Mounting telescoping supports 100 to stage support 60 may reduce the area needed for mounting rotating stage 24 to support structure 28 of mobile cart 22 (see e.g., FIG. 3). As described in connection with FIG. 11, telescoping supports 100 may be used to raise or lower rotating stage 24 in directions 102 or 104 respectively and may be configured to rotate in direction 21 (or opposite to direction 21) along with rotating stage 24 and stage support 60 during wireless communications testing of DUT 10.

Figure 13:
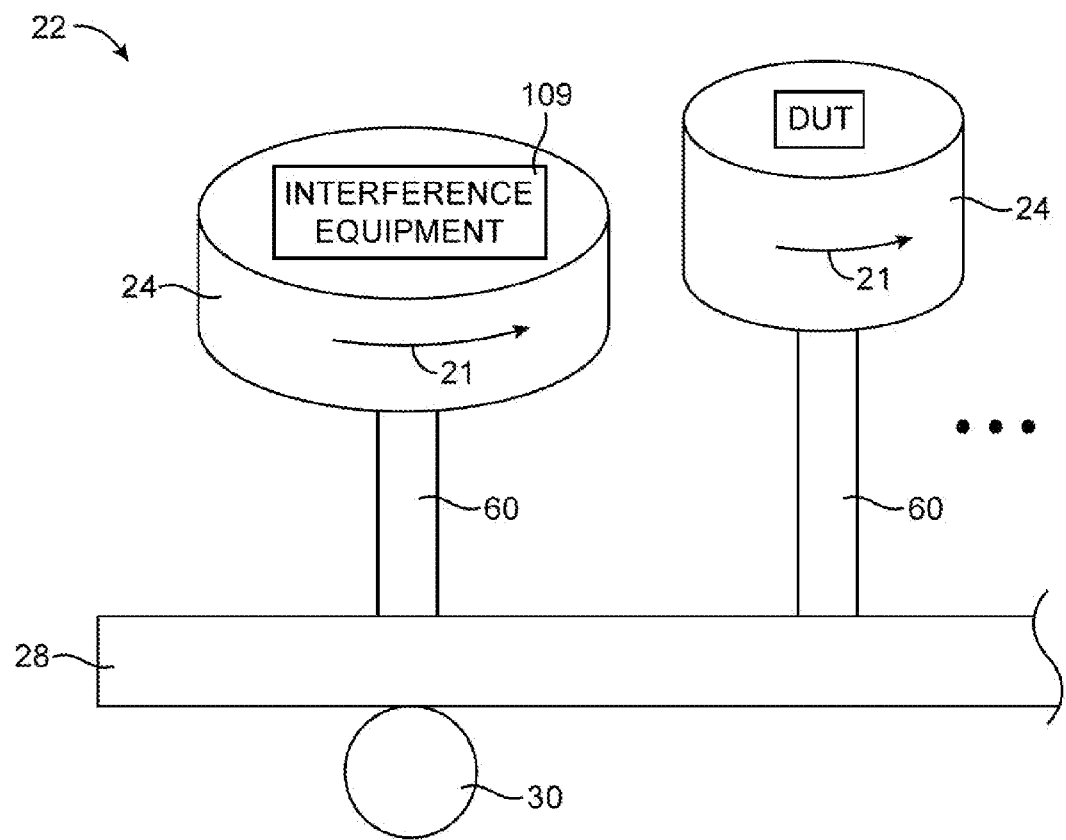
FIG. 13 is a diagram of an illustrative mobile cart that has more than one rotating stage in accordance with an embodiment of the present invention.

During wireless communications testing of DUT 10, it may sometimes be desirable to simultaneously test multiple devices, to test the effect on a single DUT 10 of an environment with multiple devices communicating simultaneously, or to test the effect of simultaneous communications using multiple technologies (e.g., WiFi®, Bluetooth®, etc.) with a single DUT 10. In order to facilitate these tests, mobile cart 22 may be provided with more than one rotating stage 24, as shown in FIG. 13. As shown in FIG. 13, each rotating stage 24 may be mounted to an associated stage support 60. Each rotating stage 24 may be configured to rotate in a direction such as direction 21, or in a direction opposite to direction 21. Additional stages may be used to mount additional communications equipment such as interference equipment 109.

Interference equipment 109 may include an additional device that is substantially similar to DUT 10 and/or communications equipment (e.g., Wifi® equipment, Bluetooth® equipment, Universal Mobile Telecommunications System equipment, Global System for Mobile Communications equipment, etc.) for communicating directly with DUT 10.

Each rotating stage 24 may be configured to rotate at a substantially similar rotation rate as another rotating stage 24 or may be configured to rotate at a different rotation rate as another rotating stage 24. Each rotating stage 24 may be configured to rotate in a same or different direction from the direction of rotation of another rotating stage 24. If desired, some rotation stages 24 may rotate while other rotation stages 24 are stationary. If desired, rotating stages 24 that support interference equipment 109 may be configured to be slave to rotating stage 24 supporting DUT 10 (e.g., stage supports 60 may be controlled by a common motor of the type shown in FIG. 3).

During wireless communications testing of DUT 10, interference equipment 109 and DUT 10 may communicate with wireless communications equipment 58 in a common communications channel using a common communications technology (e.g., Wifi® equipment, Bluetooth® equipment, Universal Mobile Telecommunications System, Global System for Mobile Communications, etc.). During wireless communications testing of DUT 10 in which interference equipment 109 and DUT 10 communicate with wireless communications equipment 58 in a common communications channel, computing equipment 56 (see FIG. 2A) may be configured to store information corresponding to which of interference equipment 109 or DUT 10 first registers and/or establishes communication with wireless communications equipment 58.

During wireless communications testing of DUT 10, interference equipment 109 and DUT 10 may communicate with wireless communications equipment 58 in different communications channels using a common communications technology. If desired, DUT 10 and interference equipment 109 may each be Multiple-input multiple-output (MIMO) devices that actively select available communications channels. Computing equipment 56 may be configured to store information corresponding to the selection of channels in competing MIMO devices.

If desired, interference equipment 109 and DUT 10 may communicate with wireless communications equipment 58 using different communications technologies (e.g., DUT 10 may communicate using Wifi® communications technology while interference equipment 109 communicates using cellular telephone technology, Bluetooth® technology, or other technology). During wireless communications testing of DUT 10 in which interference equipment 109 and DUT 10 communicate with wireless communications equipment 58 using different communications technologies, computing equipment 56 may store data corresponding to wireless communications tests of more than one DUT 10 (i.e., interference equipment 109 may be an additional DUT that is tested concurrently with DUT 10). During wireless communications testing of DUT 10, interference equipment 109 may be configured to only transmit data, to only receive data, or to emulate communication during normal operation of a device such as DUT 10.

In an alternative embodiment, during wireless testing of DUT 10, DUT 10 may exchange data directly with interference equipment 109. In wireless communications tests in which DUT 10 exchanges data directly with interference equipment 109, rotating stage 24 on which interference equipment 109 is mounted may remain stationary (i.e., may not rotate) while rotating stage 24 on which DUT 10 is mounted rotates. In wireless communications tests in which DUT 10 exchanges data directly with interference equipment 109, DUT 10 may communicate with interference equipment 109 using a first communications technology while DUT 10 communicates with communications equipment 58 using a second communications technology that is different from the first communications technology (e.g., DUT 10 may communicate with communications equipment using Wifi® communications technology while DUT 10 communicates with interference equipment 109 using cellular telephone technology, Bluetooth® technology, or other technology).

Figure 14:
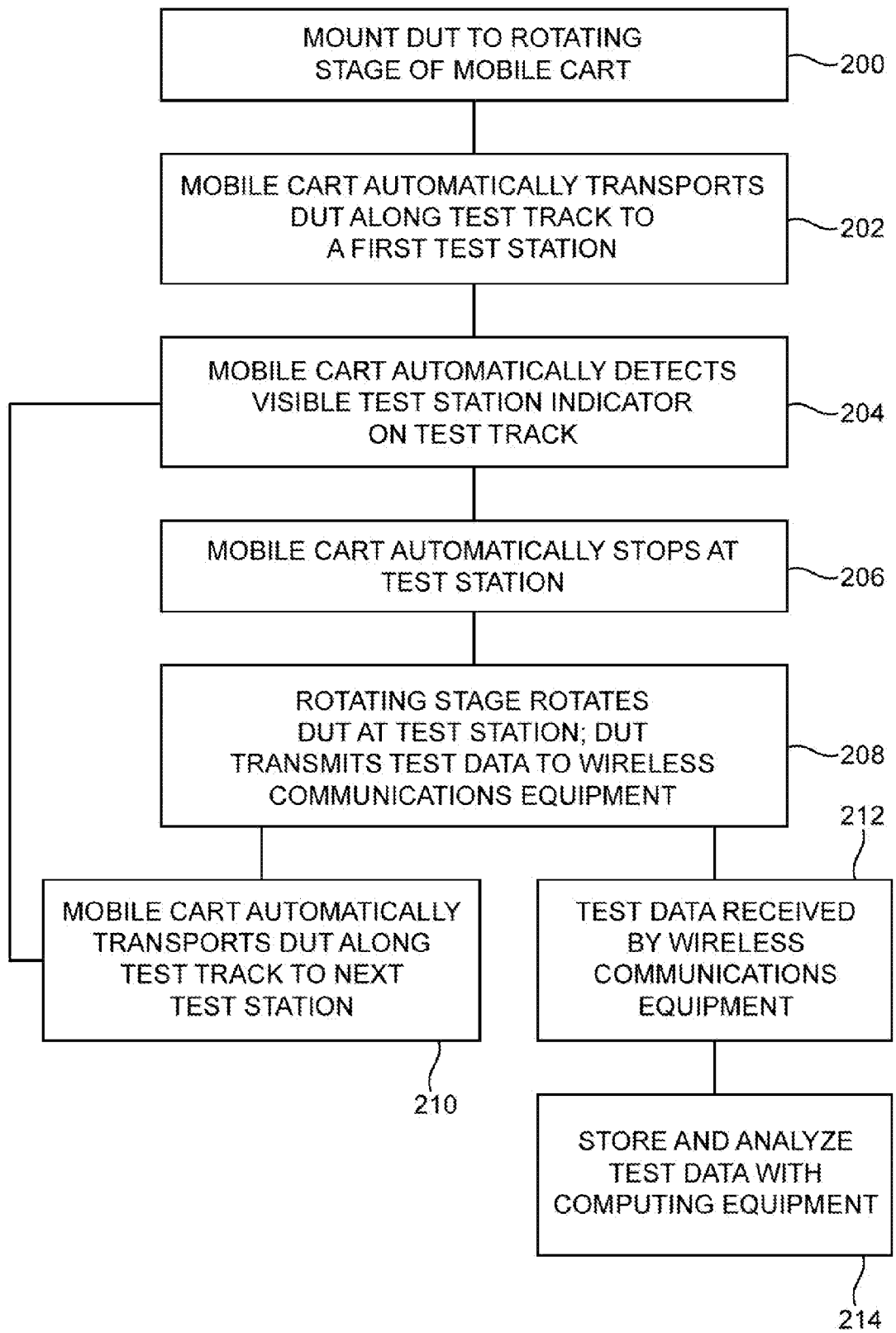
FIG. 14 is a flow chart of illustrative steps involved in performing wireless communications tests of devices under test in accordance with an embodiment of the present invention.

To conduct wireless communications testing of a device under test using a computer controlled mobile cart, the steps of the illustrative flowchart of FIG. 14 may be performed.

At step 200 a DUT 10 may be mounted to rotating stage 24 of mobile cart 22. DUT 10 may be mounted to rotating stage 24 using mounting structures, may be embedded within rotating stage 24 or may be placed on rotating stage 24. If desired, interference equipment 109 may also be mounted to an additional rotating stage 24.

At step 202 mobile cart 22 may automatically (i.e., without human interaction) transport DUT 10 along a visible guide track such as test track 44 to a first test station 46. Automatically transporting DUT 10 along test track 44 may include following one or more bends, or one or more turns in test track 44 using an optical sensor such as optical sensor 32 mounted to mobile cart 22.

At step 204, using an optical sensor such as optical sensor 32, mobile cart 22 may automatically detect a visible test station indicator such as visible test station indicator 48 on test track 44.

At step 206, mobile cart 22 may automatically stop for a predetermined amount of time at a test station. The predetermined amount of time may correspond to a duration required to transmit a predetermined amount of test data.

At step 208, while mobile cart 22 is stopped at the test station, rotating stage 24 may rotate DUT 10 through a predetermined rotation angle. While rotating stage 24 rotates DUT 10, DUT 10 may transmit test data to wireless communications equipment 58. If desired, while mobile cart 22 is stopped at the test station, DUT 10 may transmit test data to interference equipment 109 while transmitting data to communications equipment 58. If desired, while mobile cart 22 is stopped at the test station, interference equipment 109 may transmit data to communications equipment 58 while DUT 10 transmits data to communications equipment 58.

At step 210, mobile cart 22 may automatically transport DUT 10 along test track 44 to the next test station 46. Following step 210, steps 204, 206, and 208 may be repeated for subsequent test stations 46 along test track 44.

At step 212, test data transmitted by DUT 10 at step 208 may be received by wireless communications equipment 58. Step 212 may be performed concurrently with step 210.

At step 214, test data received by wireless communications equipment 58 may be stored and analyzed using computing equipment 56. Steps 212 and 214 may be repeated following each transmission of test data at step 208 at each test station along test track 44. Steps 202, 204, 206, 208, 210, 212, and 214 may subsequently be repeated for testing of additional DUTs 10.

The foregoing is merely illustrative of the principles of this invention and various modifications can be made by those skilled in the art without departing from the scope and spirit of the invention.

What is claimed is:

1. A method of testing a device under test with a computer controlled mobile cart, wherein the computer controlled mobile cart includes a rotating stage on which the device under test is mounted and an additional stage on which interference equipment is mounted, the method comprising:
   with the computer controlled mobile cart, transporting the device under test to a plurality of test stations at different locations;
   with the device under test, transmitting wireless test data in a communication channel while at each of the plurality of test stations;
   with the interference equipment, wirelessly interfering with the device under test by transmitting radio-frequency signals in the communication channel concurrently with transmission of the wireless test data in the communication channel by the device under test; and
   with the rotating stage, rotating the device under test while the device under test transmits the test data.

2. The method defined in claim 1, wherein the computer controlled mobile cart further comprises an optical sensor, the method further comprising:
   with the optical sensor, locating each of the plurality of test stations.

3. The method defined in claim 2 wherein the optical sensor includes a plurality of light sensors, and wherein locating each of the plurality of test stations comprises:
   with the light sensors, detecting a visible test station indicator.

4. The method defined in claim 3, wherein the computer controlled mobile cart includes a plurality of motors, a plurality of wheels and a plurality of spools that store cables and wherein transporting the device under test to the plurality of test stations comprises:
   with a first portion of the plurality of motors, turning at least some of the plurality of wheels to move the computer controlled mobile cart; and
   with a different portion of the plurality of motors, turning the plurality of spools to maintain a torque on the cables.

5. The method defined in claim 4 wherein the visible test station indicator comprises a visible test station indicator on a visible guide track, the method further comprising:
   with the light sensors, detecting a first position of the computer controlled mobile cart with respect to the visible test track; and
   with the at least some of the plurality of wheels, moving the computer controlled mobile cart to a second position with respect to the visible test track.

6. The method defined in claim 1 further comprising:
   with wireless communications equipment, receiving the wireless test data transmitted by the device under test at each of the plurality of test stations; and
   with computing equipment, storing and analyzing the wireless test data received by the wireless communications equipment.

7. A test system for wireless communications testing of a device under test, comprising:
   a mobile cart for transporting the device under test;
   interference equipment mounted on the mobile cart that is configured to interfere with radio-frequency communication by the device under test by wirelessly transmitting radio-frequency signals in a communication channel concurrently with transmission of wireless test data by the device under test in the communication channel;

a telescoping support structure on the mobile cart that is configured to support the device under test while the mobile cart transports the device under test and that is configured to raise and lower the device under test during the wireless communications testing;

a visible test track along which the mobile cart transports the device under test; and control equipment for controlling the mobile cart.

8. The test system defined in claim 7 further comprising: wireless communications equipment for receiving wireless test data from the device under test.

9. The test system defined in claim 8 further comprising: computing equipment for storing and analyzing the test data received by the wireless communications equipment and for generating signals to be conveyed by the control equipment when controlling the mobile cart.

10. The test system defined in claim 7 wherein the mobile cart comprises:

a rotating stage on which the device under test is mounted;

an optical sensor; and a plurality of spools for storing cables on the mobile cart.

11. The test system defined in claim 10 wherein the cables comprise:

a power cable coupled to the control equipment; and a communications cable coupled to the control equipment.

12. The test system defined in claim 7, wherein the mobile cart further comprises a rotating stage on which telescoping support structure is mounted, wherein the rotating stage is configured to rotate the device under test while the device under test transmits radio-frequency signals.

* * * * *